(12) United States Patent
Sugai

(10) Patent No.: US 7,916,496 B2
(45) Date of Patent: Mar. 29, 2011

(54) PRINTED CIRCUIT BOARD AND ELECTRONIC APPARATUS HAVING PRINTED CIRCUIT BOARD

(75) Inventor: Takahiro Sugai, Kokubunji (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 83 days.

(21) Appl. No.: 12/467,915

(22) Filed: May 18, 2009

(65) Prior Publication Data

US 2010/0079965 A1    Apr. 1, 2010

(30) Foreign Application Priority Data

Sep. 30, 2008 (JP) ................................. 2008-255617

(51) Int. Cl.
*H05K 7/10* (2006.01)
*H05K 7/12* (2006.01)

(52) U.S. Cl. ........ 361/767; 361/763; 361/768; 361/773; 361/774

(58) Field of Classification Search .......... 361/770–774, 361/782–784, 803, 760–764, 767; 174/350–352; 257/728–730, 787–790
See application file for complete search history.

(56) References Cited

U.S. PATENT DOCUMENTS

| | | | | |
|---|---|---|---|---|
| 5,866,953 | A * | 2/1999 | Akram et al. ................ | 257/790 |
| 5,930,603 | A * | 7/1999 | Tsuji et al. .................. | 438/127 |
| 7,091,060 | B2 * | 8/2006 | Bolken et al. ................ | 438/106 |
| 2007/0035021 | A1 | 2/2007 | Suzuki et al. | |
| 2008/0303145 | A1 * | 12/2008 | Takizawa et al. ............. | 257/737 |

FOREIGN PATENT DOCUMENTS

| | | |
|---|---|---|
| JP | U 01-97557 | 6/1989 |
| JP | U 06-7250 | 1/1994 |
| JP | H07-220972 A | 8/1995 |
| JP | 10-098077 | 4/1998 |
| JP | 10-098077 A | 4/1998 |
| JP | 2001-267473 | 9/2001 |
| JP | 2001-267473 A | 9/2001 |
| JP | 2007-048976 A | 2/2007 |
| JP | 2008-153583 A | 7/2008 |

OTHER PUBLICATIONS

Explanation of Non-English Language Reference(s).
Notification of Reason for Refusal mailed by Japan Patent Office on Aug. 25, 2009 in the corresponding Japanese patent application No. 2008-255617.

* cited by examiner

*Primary Examiner* — Tuan T Dinh
(74) *Attorney, Agent, or Firm* — Knobbe, Martens, Olson & Bear LLP

(57) ABSTRACT

According to an aspect of the present invention, there is provided a printed circuit board including: a semiconductor package including a parallelepiped body, and solder balls provided on a face of the parallelepiped body; a printed wiring board including a mounting face, the mounting face configured to mount the plurality of solder balls; a first bonding member including a first glass transition temperature, the first bonding member disposed around the parallelepiped body and configured to bond the semiconductor package and the printed wiring board; an electronic component mounted on the mounting face on an opposite side to the semiconductor package with respect to the first bonding member; and a second bonding member including a second glass transition temperature that is higher than the first glass transition temperature, the second bonding member disposed onto the mounting face to cover the electronic component.

4 Claims, 8 Drawing Sheets

US 7,916,496 B2

PRINTED CIRCUIT BOARD AND ELECTRONIC APPARATUS HAVING PRINTED CIRCUIT BOARD

CROSS-REFERENCE TO RELATED APPLICATIONS

This application is based upon and claims the benefit of priority from Japanese Patent Application No. 2008-255617, filed on Sep. 30, 2008, the entire contents of which are incorporated herein by reference.

BACKGROUND

1. Field

An aspect of the present invention relates to a printed circuit board in which a semiconductor package and a printed wiring board are bonded to each other through a bonding member, and an electronic apparatus having the printed circuit board.

2. Description of the Related Art

Some printed circuit boards to be used in a portable computer have a printed wiring board on which a semiconductor package of a Ball Grid Array (EGA) or Chip Sized Package (CSP) type is mounted. In the printed circuit boards, a semiconductor package and a printed wiring board are connected to each other through a plurality of solder balls. However, a structure for fixing the printed wiring board to the semiconductor package is separately employed in order to ensure a connecting reliability.

For example, a corner of the semiconductor package is fixed to the printed wiring board through a bonding member formed by a resin. A filling position of the bonding member is adjacent to a solder bonding portion and peripheral components. For this reason, a situation in which the bonding member flows into the solder bonding portion and the peripheral components might occur. There is disclosed a technique for forming a convex portion on the printed wiring board through silk printing, thereby suppressing a spread of the bonding member in order to cope with the problem (see JP-A-2007-48976 (Page 8, FIG. 5)).

Even if the spread of the bonding member can be suppressed by using the technique, however, there is a possibility that the peripheral components might be broken in a maintenance work. More specifically, in recent years, a reduction in a size of an electronic apparatus has been advanced and there is employed high density mounting in which other peripheral components are disposed just in the vicinity of the bonding member. When the bonding member is removed in order to carry out the maintenance work such as an exchange and repair of the semiconductor package, accordingly, there is a possibility that heat might influence and break the other peripheral components when the bonding member is heated to be softened.

On the other hand, there is a possibility that the fixation of the semiconductor package to the printed wiring board might be insufficient when an amount of the bonding member to be disposed is decreased in consideration of the peripheral components.

SUMMARY

One of objects of the invention is to provide a printed circuit board which ensures an excellent maintainability in a connection of a semiconductor package and a printed wiring board.

According to an aspect of the present invention, there is provided a printed circuit board including: a semiconductor package including a parallelepiped body, and a plurality of solder balls provided on a face of the parallelepiped body; a printed wiring board including a mounting face, the mounting face configured to mount the plurality of solder balls; a first bonding member including a first glass transition temperature, the first bonding member disposed around the parallelepiped body and configured to bond the semiconductor package and the printed wiring board; an electronic component mounted on the mounting face on an opposite side to the semiconductor package with respect to the first bonding member; and a second bonding member including a second glass transition temperature that is higher than the first glass transition temperature, the second bonding member disposed onto the mounting face to cover the electronic component.

BRIEF DESCRIPTION OF THE SEVERAL VIEWS OF THE DRAWINGS

A general architecture that implements the various feature of the present invention will now be described with reference to the drawings. The drawings and the associated descriptions are provided to illustrate embodiments of the present invention and not to limit the scope of the present invention.

DETAILED DESCRIPTION

An embodiment of a printed circuit board 7 according to the invention will be described below with reference to the drawings by taking, as an example, an application to a portable computer 1 to be one of electronic apparatuses.

Figure 1:
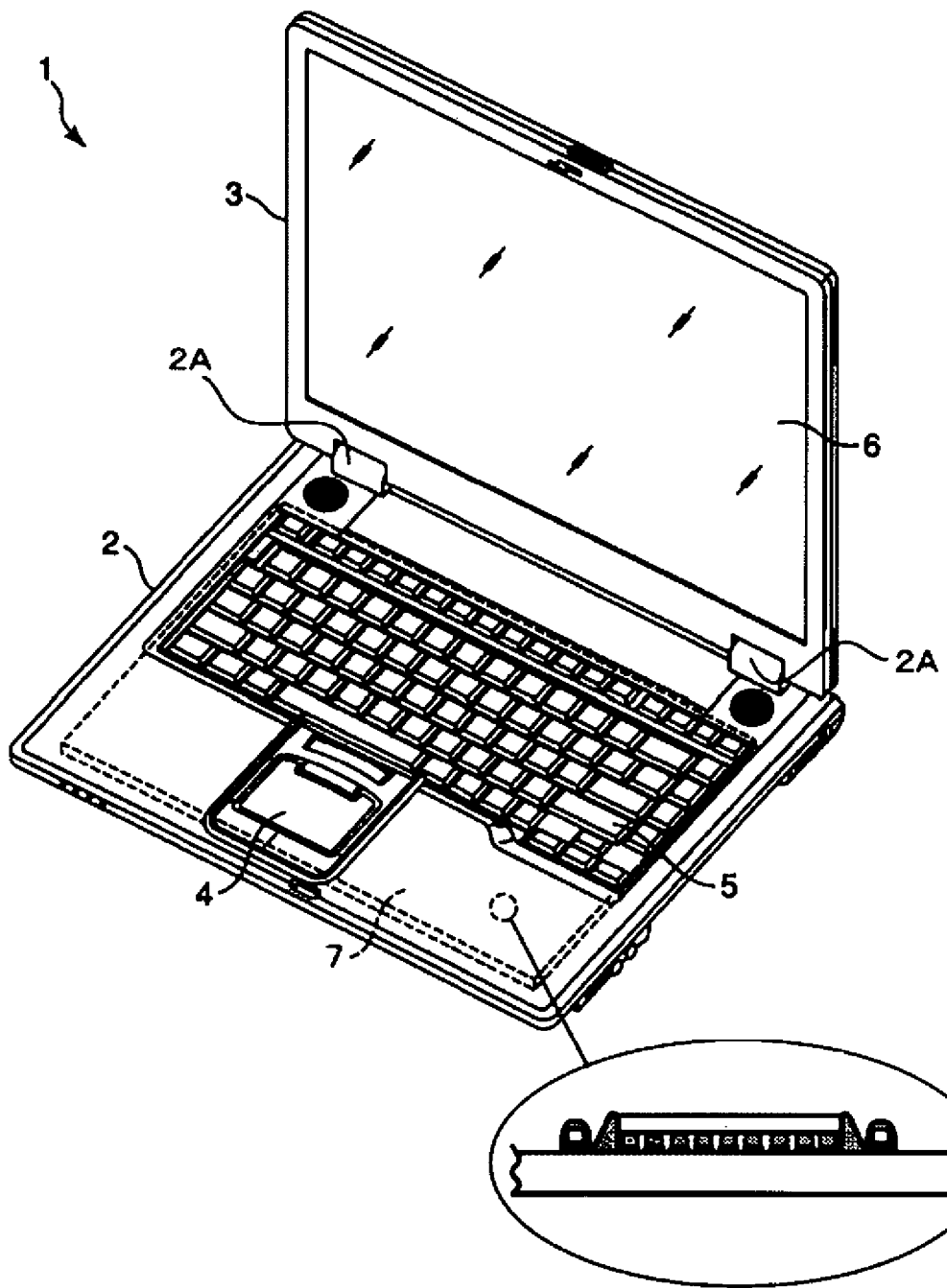
FIG. 1 is an exemplary perspective view showing a portable computer according to an embodiment of the invention.

FIG. 1 is a perspective view showing the portable computer 1 according to the embodiment of the invention. In FIG. 1, a display portion casing 3 is rotatably provided on a body 2 of the portable computer 1 through a hinge mechanism 2A. The body 2 is provided with operating portions such as a pointing device 4 and a keyboard 5. The display portion casing 3 is provided with a display device 6 such as a Liquid Crystal Display (LCD), for example.

Moreover, the body 2 is provided with a printed circuit board (a mother board) 7 incorporating a control circuit for controlling the operating portions such as the pointing device 4 and the keyboard 5, and the display device 6.

(First Embodiment of Printed Circuit Board)

Figure 2A:
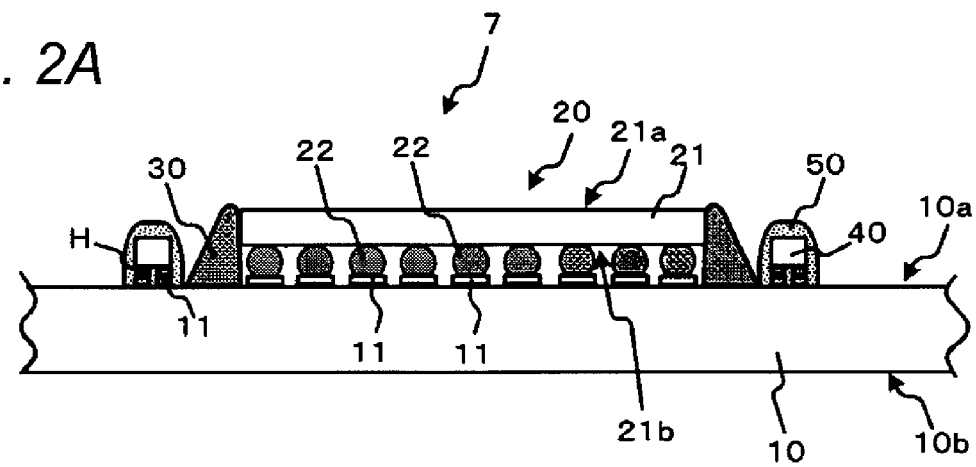
FIGS. 2A and 2B are exemplary views showing a first embodiment of a printed circuit board to be received in a casing of the portable computer illustrated in FIG. 1.
Figure 2B:
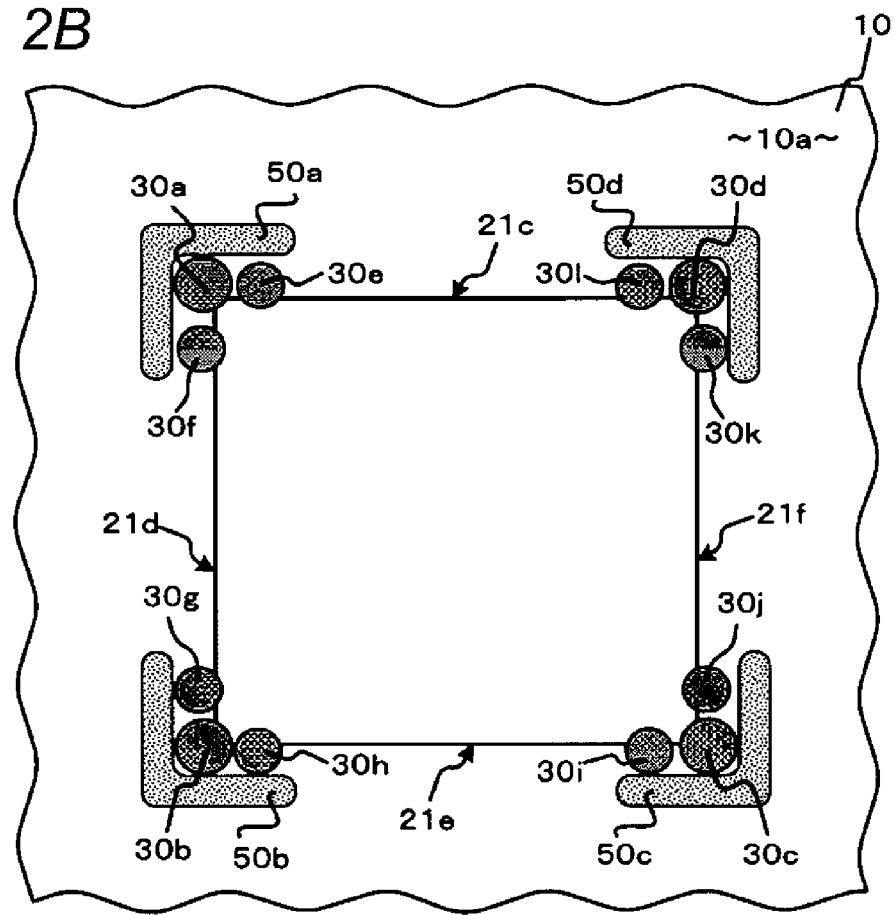

FIGS. 2A and 2B is a view showing a first embodiment of the printed circuit board 7 received in the casing of the portable computer 1 illustrated in FIG. 1. FIG. 2A is a sectional view and FIG. 2B is a top view.

The printed circuit board 7 has a printed wiring board 10, a semiconductor package 20, a bonding member 30, an electronic component 40 and a component protecting member 50.

The printed wiring board 10 has a first face 10a and a second face 10b. The printed wiring board 10 is provided with a plurality of pads 11 in regions opposed to each of solder balls 22 in the semiconductor package 20 which will be described below and in a region on which the electronic component 40 is mounted. The printed wiring board 10 may be a single layer plate or a multilayer plate. The printed wiring board 10 may have a wiring and an electrode on the first face 10a, the second face 10b or an inner layer of the multilayer plate. Moreover, a solder resist may be applied to the first face 10a or the second face 10b.

The semiconductor package 20 has a package body 21 shaped, for example, in an almost rectangular parallelepiped and the solder balls 22 protruded from one of faces of the package body 21. More specifically, the package body 21 is configured by an upper face 21a, a lower face 21b opposed to the upper face 21a, and side faces 21c, 21d, 21e and 21f surrounding respective peripheries of the upper face 21a and the lower face 21b and forms an almost rectangular parallelepiped which is flat. The semiconductor package 20 is of a BGA type or a CSP type, for example.

The bonding member 30 corresponds to a first bonding member according to the invention and serves to bond the semiconductor package 20 and the printed wiring board 10. Usually, a thermosetting resin is used for the bonding member 30. For the bonding member 30, it is also possible to use a resin of a double fluid mixing type, a resin having a property to carry out curing through an irradiation of Ultraviolet (UV), and a resin for injecting a curing agent to promote curing after an application of the bonding member 30 in place of the thermosetting resin. It is preferable that the bonding member 30 have an insulating property.

In the embodiment, the bonding member 30 is applied to corners and vicinities of the corners indicated as 30a to 30l. More specifically, the bonding member 30 is not applied circularly over a whole outer periphery of the package body 21 but a position to which the bonding member 30 is to be applied is limited. Consequently, the package body 21 and the printed circuit board 7 can be prevented from being sealed from each other. The reason is as follows. There is a possibility that sealed air might expand to break the package body 21 in a heat treatment for bonding the solder ball 22 to the bonding member 30. Accordingly, it is desirable that at least one place in a periphery of the package body 21 should be opened to apply the bonding member 30 for bonding the package body 21 to the printed wiring board 10.

The electronic component 40 is mounted on the printed wiring board 10. The electronic component 40 is mounted in a position in the vicinity of the bonding member 30 at a side provided apart from the semiconductor package 20. The electronic component 40 is a chip capacitor, a chip resistor or a chip inductor, for example.

The component protecting member 50 corresponds to a second bonding member according to the invention and is applied onto the electronic component 40. As shown in FIGS. 2A and 2B, in the case in which the bonding member 30 is applied to the corners indicated as 30a to 30l and the vicinity of the corners, the component protecting member 50 is applied to applying positions indicated as 50a to 50d which are opposed to the applying positions 30a to 30l to form a convex portion. In FIGS. 2A and 2B, the component protecting member 50 is continuously applied to the applying position 50a which is opposed to the three applying positions 30a, 30e and 30f. Similarly, the component protecting member 50 is continuously applied to the applying position 50b which is opposed to the three applying positions 30b, 30g and 30h. The component protecting member 50 is continuously applied to the applying position 50c which is opposed to the three applying positions 30c, 30i and 30j. The component protecting member 50 is continuously applied to the applying position 50d which is opposed to the three applying positions 30d, 30k and 30l. In a portion in which the electronic component 40 is not mounted in the applying positions 50a to 50d, the component protecting member 50 may be applied onto the first face 10a of the printed wiring board 10.

Moreover, the applying positions 50a to 50d are determined based on the electronic component 40 mounted closest to the semiconductor package 20 in the respective corners. For example, if a distance between the semiconductor package 20 and the electronic component 40 is the shortest in the corner for the position 30a, the applying position 50a is a reference. The same positional relationship as a positional relationship between the applying position 50a and the semiconductor package 20 is maintained and the applying positions 50b to 50d are determined also in the corners for the positions 30b to 30d. Thus, it is possible to suppress a wetting spread of the bonding member 30 more effectively. More specifically, in the case in which the electronic component 40 is not mounted at all in an opposed position to the bonding member 30 in any of the corners, the component protecting member 50 is applied to a position of the corner which corresponds to the other corners in which the electronic component 40 is present. In the case in which the distance between the semiconductor package 20 and the electronic component 40 is more than a threshold distance, the component protecting member 50 may be applied to a close position to the semiconductor package 20 from the corresponding position.

In the embodiment, the component protecting member 50 covers a whole face of the electronic component 40 and is applied to surround the electronic component 40 together with the printed wiring board 10. Moreover, a configuration for interrupting the wetting spread of the bonding member 30 is sufficient. Therefore, the component protecting member 50 may be applied to one face of the electronic component 40 at the bonding member 30 side.

Thus, the component protecting member 50 is continuously applied to an opposed position to the position in which the bonding member 30 is applied. Consequently, the convex portion is formed on the first face 10a of the printed wiring board 10 to suppress the wetting spread of the bonding member 30.

A material having a higher glass transition temperature than that in the bonding member 30 is employed for the component protecting member 50. More specifically, there is used a material having such a property that only the bonding member 30 is softened and the component protecting member 50 is not softened but holds a certain strength in a work for removing the bonding member 30. It is preferable that the component protecting member 50 has an insulating property.

The component protecting member 50 is a thermosetting resin, a resin of a double fluid mixing type or a resin having such a property as to be cured through an irradiation of UV, and specifically, an epoxy resin or an acrylic resin is used.

Figure 3:
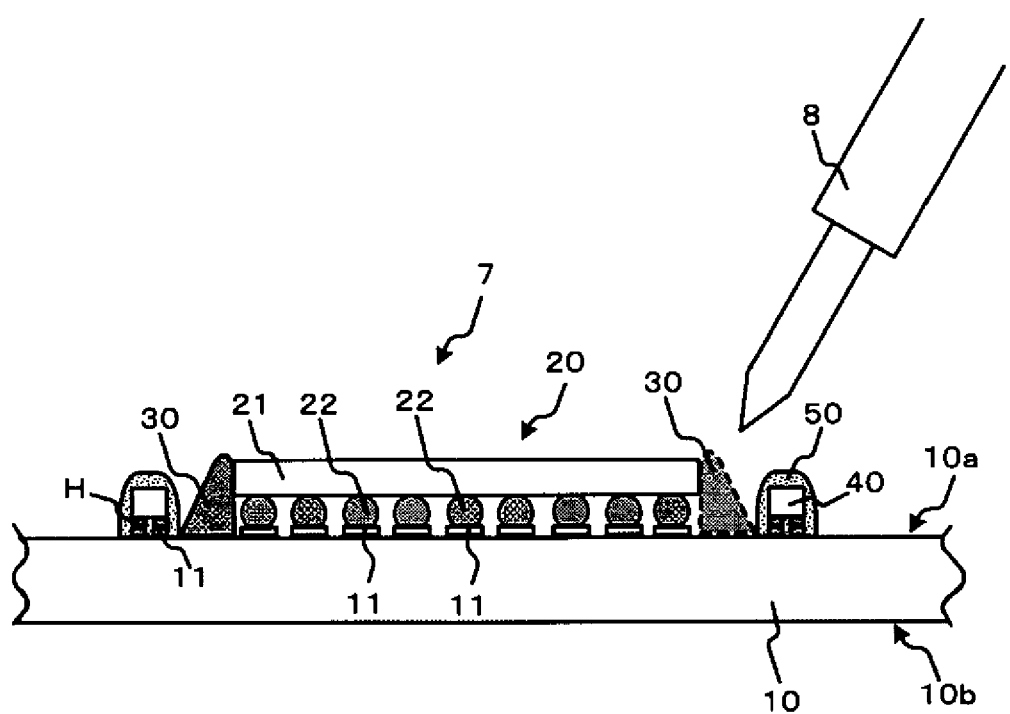
FIG. 3 is a view showing an example of a state of a work for removing a bonding member for bonding a semiconductor package and a printed wiring board in the printed circuit board to be received in the casing of the portable computer illustrated in FIG. 1.

FIG. 3 is a view showing an example of a state of the work for removing the bonding member 30 for bonding the semiconductor package 20 to the printed wiring board 10 in the printed circuit board received in the casing of the portable computer 1 illustrated in FIG. 1. When the bonding member 30 is heated by means of a soldering iron 8, it is possible to soften the bonding member 30 (a member obtained by softening the cured bonding member 30 through reheating will be hereinafter referred to as a "bonding member 30'"), thereby removing the bonding member 30' by means of a tool such as a pincette. More specifically, it is possible to exchange the semiconductor package 20. On the other hand, the component protecting member 50 has a higher glass transition temperature than that in the bonding member 30. Accordingly, the component protecting member 50 is not softened but holds a certain strength, and the electronic component 40 is maintained to be protected by the component protecting member 50. Usually, a resin to be softened at 150 to 200 degrees Celsius is used for the bonding member 30. Therefore, it is preferable to use, for the component protecting member 50, a resin which is not softened at 150 to 200 degrees Celsius. By employing a material having the property for the bonding member 30 and the component protecting member 50, it is possible to protect the electronic component 40 in a maintenance work. More specifically, the electronic component 40 is protected from heat and the tool for carrying out the work for removing the bonding member 30 through the component protecting member 50 in the work for removing the bonding member 30

By applying the component protecting member 50 to the electronic component 40 as described above, it is possible to implement a structure in which the convex portion is formed on the first face 10a of the printed wiring board 10 to suppress the wetting spread of the bonding member 30. Consequently, the region to which the bonding member 30 is to be applied is restricted. Therefore, it is possible to enhance an efficiency of the work for removing the bonding member 30. Moreover, there is no possibility that the bonding member 30 might be applied to the electronic component 40 positioned around the semiconductor package 20. Accordingly, it is possible to apply the bonding member 30 necessarily and sufficiently. Therefore, it is possible to mount the semiconductor package 20 with a strength maintained in a limited mounting area.

By employing, for the component protecting member 50, a material having a higher glass transition temperature than that in the bonding member 30, furthermore, it is possible to protect the electronic component 40 provided around the semiconductor package 20 from the heat and the tool for carrying out the removing work.

Moreover, the component protecting member 50 functions as a reinforcing plate formed around the semiconductor package 20 to suppress a deformation of the printed wiring board 10 within a range in which the semiconductor package 20 is mounted, and a fastness property of the printed circuit board 7 can be enhanced.

As described above, according to the embodiment, the work for removing the bonding member 30 can easily be carried out in the connection of the semiconductor package 20 and the printed wiring board 10, there is little possibility that the electronic component 40 positioned around the semiconductor package 20 might be broken, and a fine maintainability can be ensured.

Figure 4A:
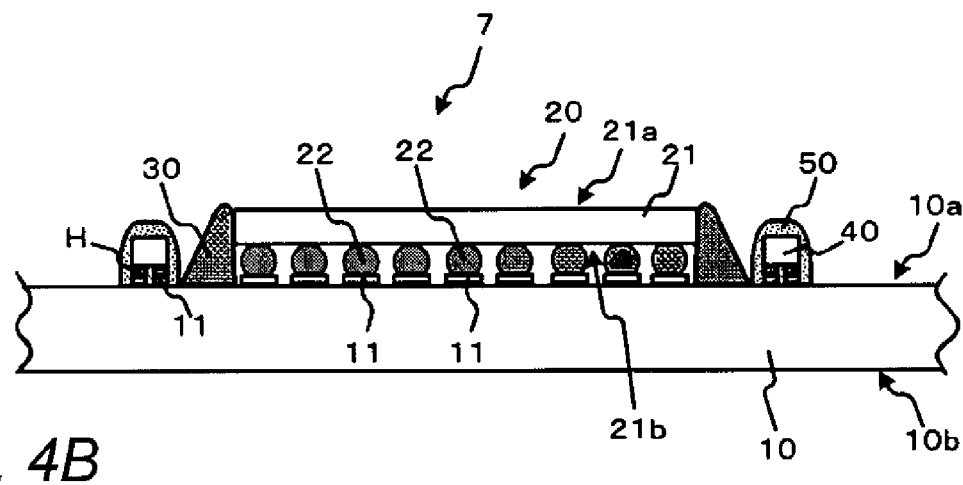
FIGS. 4A and 4B are exemplary views showing a variant of the first embodiment of the printed circuit board to be received in the casing of the portable computer illustrated in FIG. 1.
Figure 4B:
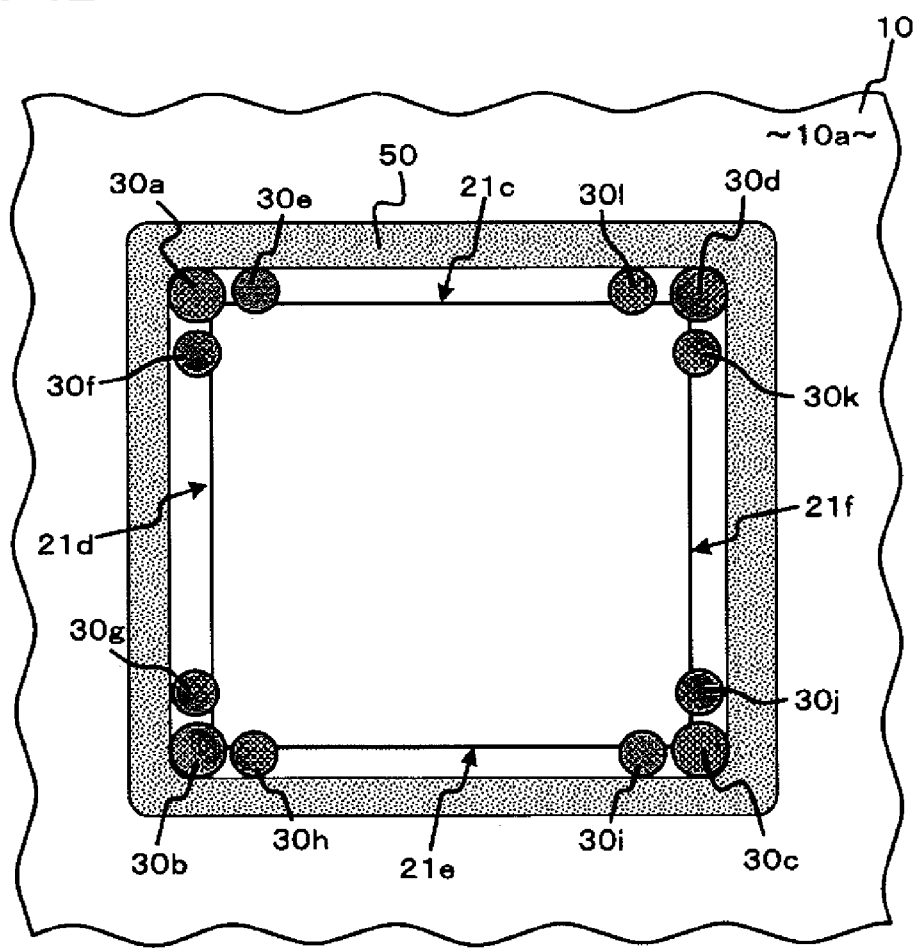

(Variant of First Embodiment of Printed Circuit Board)
FIGS. 4A and 4B Are views showing a variant of the first embodiment of the printed circuit board 7 received in the casing of the portable computer 1 illustrated in FIG. 1.

The variant of the embodiment is different from the first embodiment in respect of the region to which the component protecting member 50 is to be applied. Although the component protecting member 50 is mainly applied to the opposed position to the applying position of the bonding member 30 in the first embodiment, the component protecting member 50 surrounds the semiconductor package 20 to take a shape of a ring in the variant. Also in the variant, the electronic component 40 does not need to be always present in the region to which the component protecting member 50 is to be applied. The region to which the component protecting member 50 is to be applied may be present directly on the first face 10a where the electronic component 40 is not present.

In the variant, by applying the component protecting member 50 around the semiconductor package 20 circularly, it is possible to suppress a deformation of the printed circuit board 7 in the mounting portion of the semiconductor package 20 more effectively.

Figure 5A:
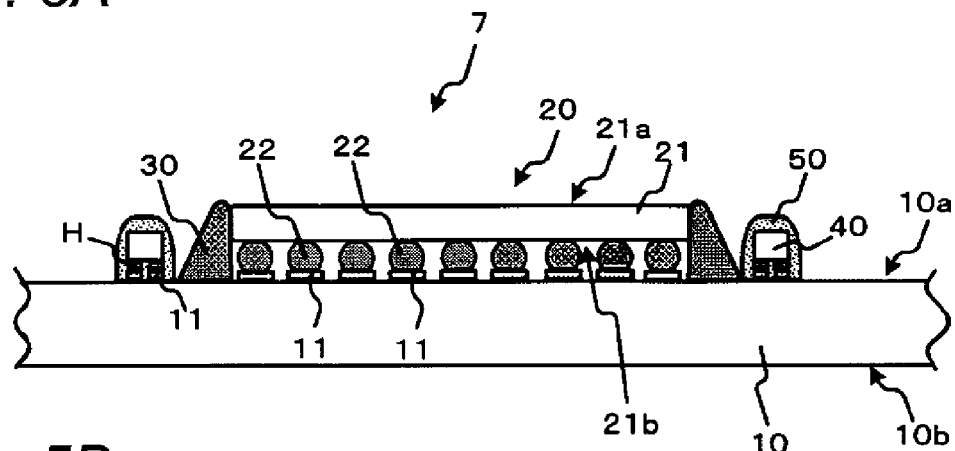
FIGS. 5A and 5B are exemplary views showing a second embodiment of the printed circuit board to be received in the casing of the portable computer illustrated in FIG. 1.
Figure 5B:
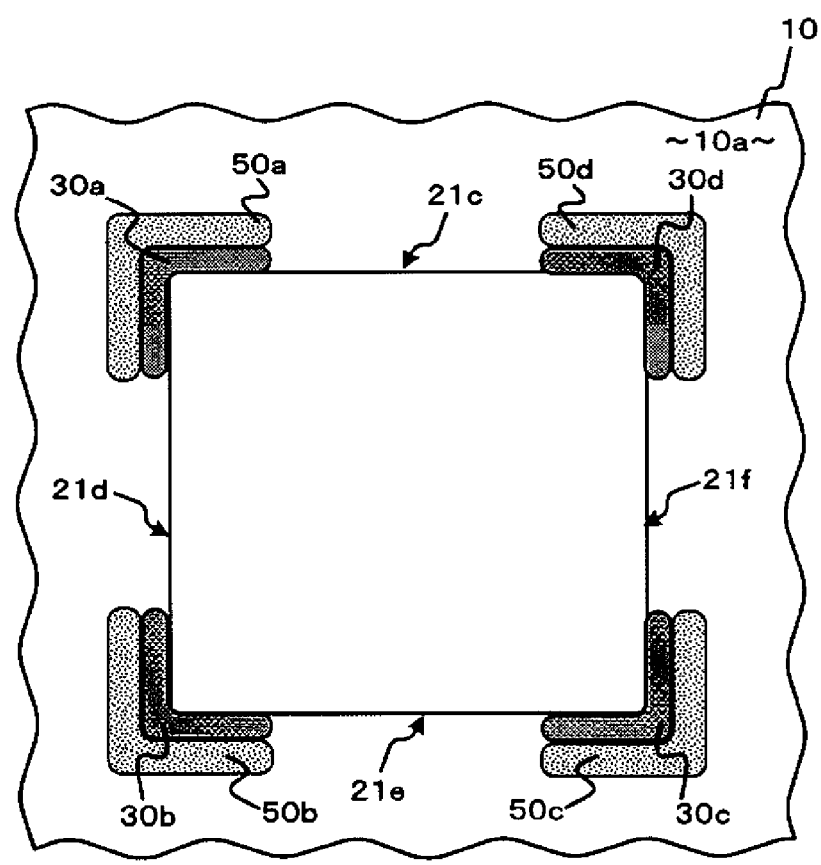

(Second Embodiment of Printed Circuit Board)
FIGS. 5A and 5B are views showing a second embodiment of the printed circuit board 7 received in the casing of the portable computer 1 illustrated in FIG. 1. In the embodiment, a bonding member 30 is continuously applied to corners and the vicinity of the corners of a package body 21. More specifically, the embodiment is different from the first embodiment in that the bonding member 30 to be applied to each of the corners is integrated.

Also in the embodiment, a component protecting member 50 is applied to applying positions 50a to 50d which are opposed to applying positions 30a to 30d in the same manner as in the first embodiment. More specifically, a convex portion is formed on a first face 10a of the printed circuit board in an opposed position to a position to which the bonding member 30 is to be applied. Thus, a wetting spread of the bonding member 30 is suppressed. The application of the component protecting member 50 to a portion on which an electronic component 40 is not mounted and the applying position of the component protecting member 50 on which the electronic component 40 is not mounted at all are the same as those in the first embodiment.

By employing, for the component protecting member 50, a material having a higher glass transition temperature than that in the bonding member 30, furthermore, it is possible to protect the electronic component 40 provided around a semiconductor package 20 from heat and a tool for carrying out a removing work in the same manner as in the first embodiment.

As described above, also in the embodiment, it is possible to ensure a fine maintainability in a connection of the semiconductor package 20 and a printed wiring board 10.

In the embodiment, the bonding member 30 is applied integrally in each of the corners differently from the first embodiment. Therefore, the removing work can be carried out more easily and a fine maintainability can be obtained.

Figure 6A:
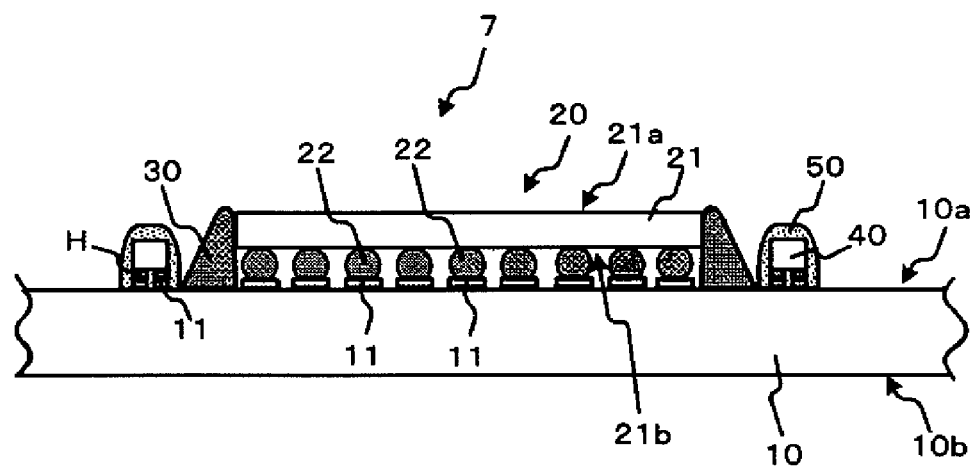
FIGS. 6A and 6B are exemplary views showing a variant of the second embodiment of the printed circuit board to be received in the casing of the portable computer illustrated in FIG. 1.
Figure 6B:
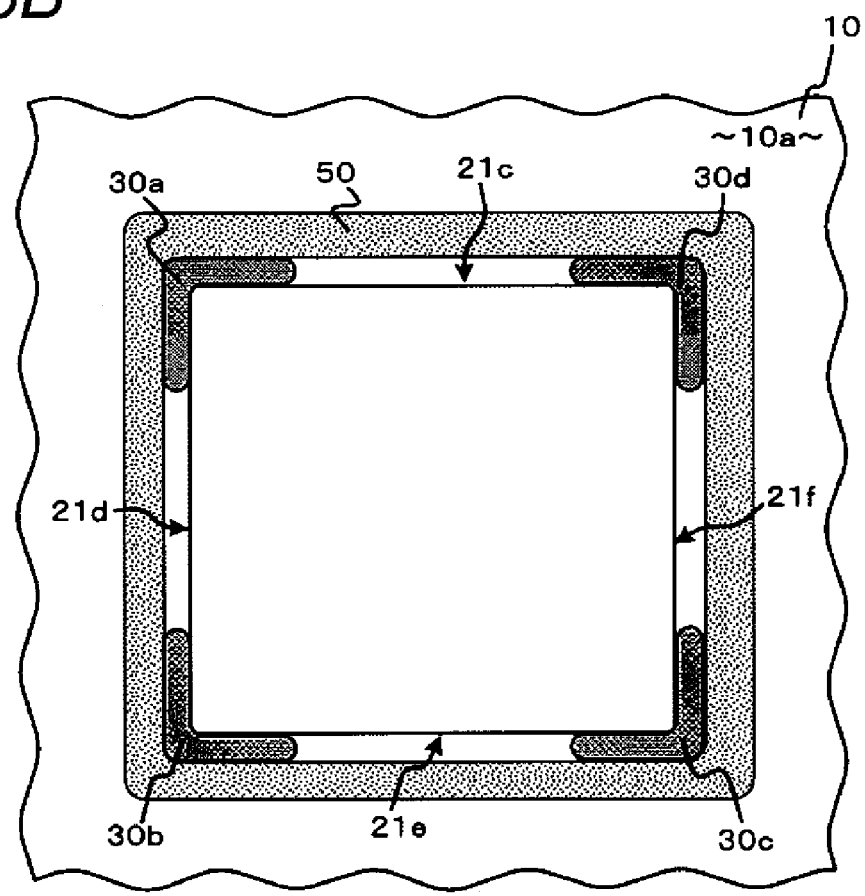

(Variant of Second Embodiment of Printed Circuit Board)
FIGS. 6A and 6B are views showing a variant of the second embodiment of the printed circuit board 7 received in the casing of the portable computer 1 illustrated in FIG. 1.

The variant of the embodiment is different from the second embodiment in respect of the region to which the component protecting member 50 is to be applied. Although the component protecting member 50 is mainly applied to the opposed position to the applying position of the bonding member 30 in the second embodiment, the component protecting member 50 surrounds the semiconductor package 20 to take a shape of a ring in the variant. Also in the variant, the electronic component 40 does not need to be always present in the region to which the component protecting member 50 is to be applied. The region to which the component protecting member 50 is to be applied may be present directly on the first face 10a where the electronic component 40 is not present.

In the variant, by applying the component protecting member 50 around the semiconductor package 20 circularly, it is possible to suppress a deformation of the printed circuit board 7 in a mounting portion of the semiconductor package 20 more effectively as compared with the second embodiment.

(First Method of Manufacturing Printed Circuit Board)

A first embodiment of a method of manufacturing the printed circuit board 7 will be described below with reference to FIGS. 7A to 7H. FIGS. 7A to 7H are views showing the first embodiment of the method of manufacturing the printed circuit board 7 to be received in the casing of the portable computer 1 illustrated in FIG. 1.

Figure 7A:
FIGS. 7A to 7H are exemplary views showing a first embodiment of a method of manufacturing the printed circuit board to be received in the casing of the portable computer illustrated in FIG. 1.
Figure 7B:
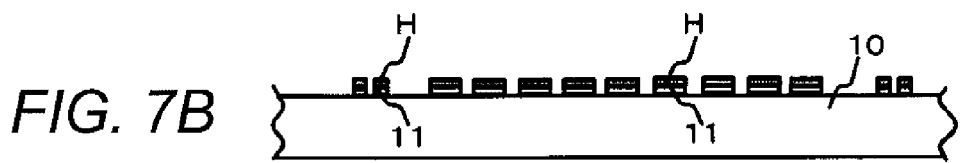

First of all, as shown in FIG. 7A, there is prepared a printed wiring board 10 having a plurality of pads 11 on which a semiconductor package 20 and electronic components 40 are mounted (a wiring board preparing step, Step S1).

Figure 7C:
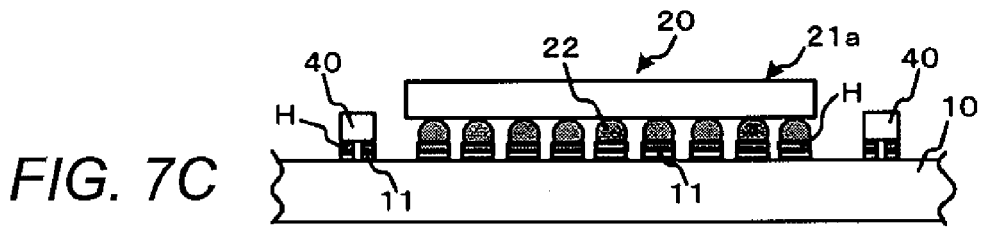
Figure 7D:
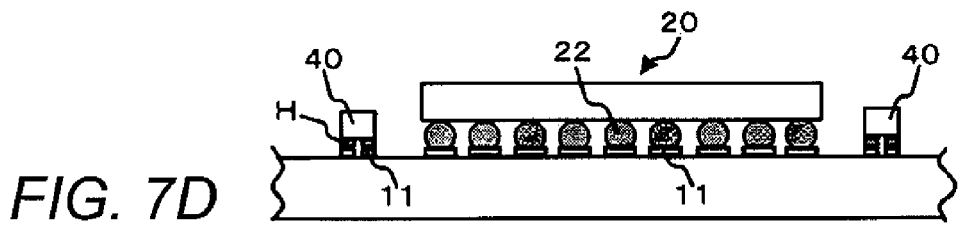
Figure 7E:
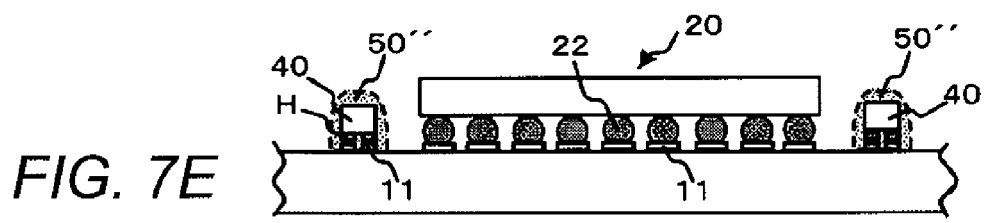

As shown in FIG. 7E, next, a solder paste H is applied to each of the pads 11 (a solder applying step, Step S2). At the solder applying step, a metal mask having an opening portion in a region to which a solder is to be applied is mounted on the printed wiring board 10 and the solder paste H is applied onto the metal mask, and the solder paste H applied onto the metal mask is uniformly applied and spread by means of a certain tool such as a squeegee. Consequently, the solder paste H is applied through the opening portion.

As shown in FIG. 7C, next, the semiconductor package 20 and the electronic components 40 are mounted on the printed wiring board 10 (a mounting step, Step S3). An upper face 21a of the semiconductor package 20 is adsorbed by using a mounting machine such as a mounter and a solder ball 22 is moved to an opposed position to the pad 11 over the printed wiring board 10, and the semiconductor package 20 is mounted from above by the mounter. The electronic components 40 are mounted in positions of a predetermined one of the pads 11 on the printed wiring board 10 by the mounter.

As shown in FIG. 7D, next, the printed wiring board 10 mounting the semiconductor package 20 and the electronic components 40 are heated to carry out bonding through a solder (a first heating step, Step S4). At the heating step, for example, a reflow furnace is used to perform a heat treatment in a predetermined temperature profile. The semiconductor package 20 is mounted on the printed wiring board 10 by integrating the solder paste H and the solder balls 22. The electronic components 40 are mounted on the printed wiring board 10 through the solder paste H.

As shown in FIG. 7E, subsequently, thermosetting component protecting members 50 are applied to the electronic components 40 (a component protecting member applying step, Step S5). The component protecting members 50 in a non-curing state before the heating is shown as a component protecting member 50".

Figure 7F:
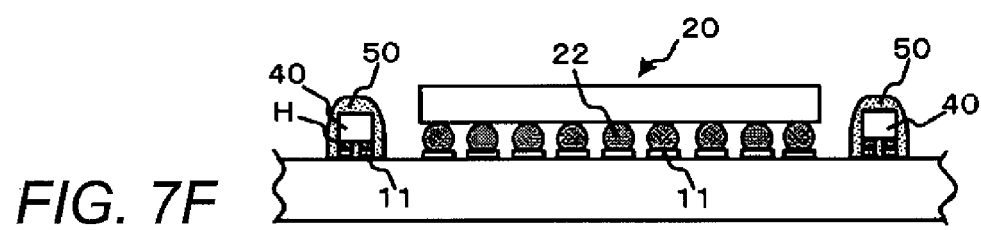

As shown in FIG. 7F, then, the printed wiring board 10 is heated to cure the component protecting members 50 (a second heating step, Step S6). More specifically, there is obtained a structure in which the electronic components 40 are covered with the component protecting members 50.

Figure 7G:
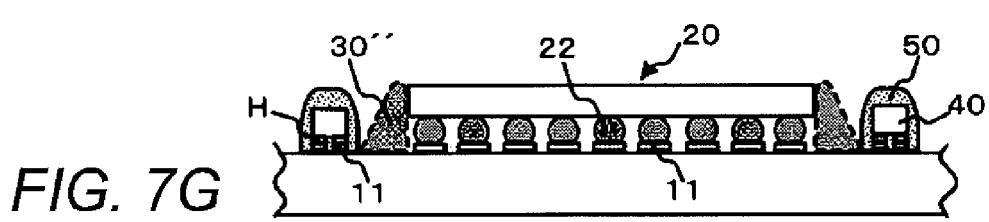

As shown in FIG. 7G, thereafter, thermosetting bonding members 30 are applied (a bonding member applying step, Step S7). More specifically, the bonding members 30 are applied to regions provided on the printed wiring board 10 in contact with side faces of a package body 21. The bonding member 30 in a non-curing state before the heating is shown as bonding members 30".

Figure 7H:
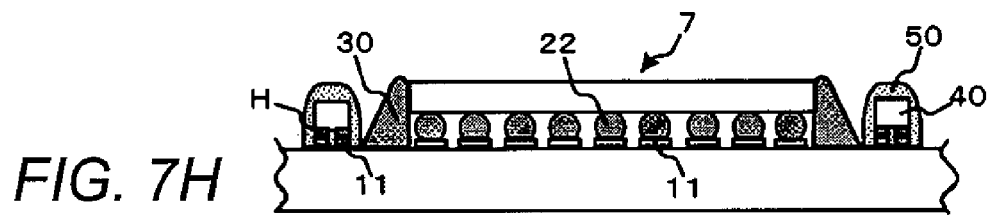

As shown in FIG. 7H, next, the printed wiring board 10 is heated to cure the bonding members 30 (a third heating step, Step S8). More specifically, the bonding members 30 are cured so that the printed wiring board 10 and the semiconductor package 20 are bonded to each other.

Through the Steps S1 to S8, the printed circuit board 7 is obtained. An advantage produced by the printed circuit board 7 is the same as that described in the first embodiment of the printed circuit board 7.

(Second Method of Manufacturing Printed Circuit Board)

A second embodiment of the method of manufacturing the printed circuit board 7 will be described below with reference to FIG. 8. FIGS. 8A to 8F are views showing the second embodiment of the method of manufacturing the printed circuit board 7 to be received in the casing of the portable computer 1 illustrated in FIG. 1.

In the embodiment, since a processing to be carried out before and at Step S4 (FIG. 8D) is the same as that before and in the Step S4 of the first method of manufacturing the printed circuit board 7 (FIG. 7D), description will be omitted.

Figure 8A:
FIGS. 8A to 8F are exemplary views showing a second embodiment of the method of manufacturing the printed circuit board to be received in the casing of the portable computer illustrated in FIG. 1.
Figure 8B:
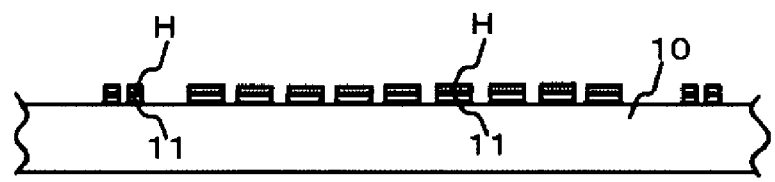
Figure 8C:
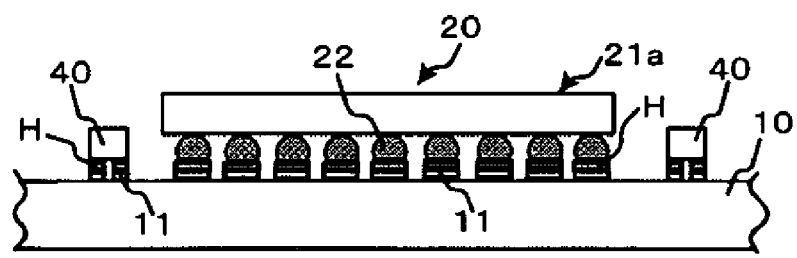
Figure 8D:
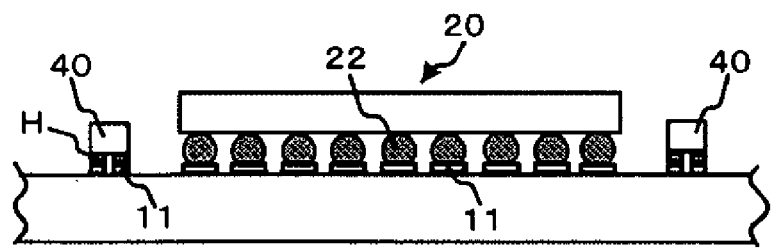
Figure 8E:
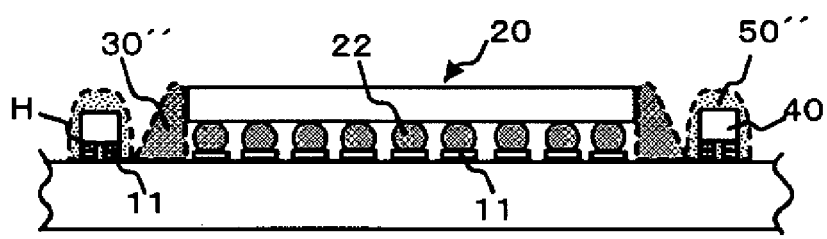

As shown in FIG. 8E, bonding members 30 and component protecting members 50 are applied (an applying step, Step S5). The bonding members 30 are applied to regions provided on a printed wiring board 10 in contact with side faces of a package body 21 and the component protecting members 50 are applied to cover electronic components 40. The boding members 30 in a non-curing state before heating is shown as a bonding member 30" and the component protecting member 50 in a non-curing state is shown as a component protecting member 50". An Order for applying the bonding members 30 and the component protecting members 50 is random (not limited) and they may be applied at the same time.

Figure 8F:
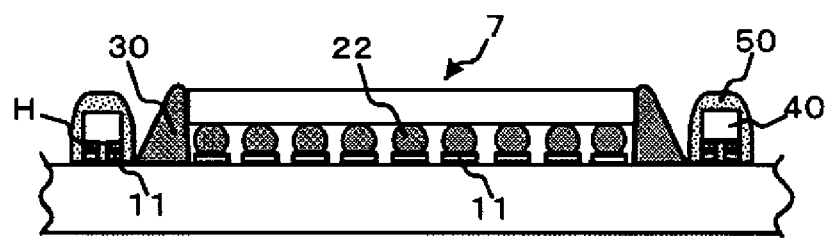

As shown in FIG. 8F, next, the printed wiring board 10 is heated to cure the bonding members 30 and the component protecting members 50 (a second heating step, Step S6). More specifically, the bonding members 30 are cured so that the printed wiring board 10 and a semiconductor package 20 are bonded to each other, and furthermore, the component protecting members 50 are cured so that the electronic components 40 are covered with the component protecting members 50.

Through the Steps S1 to S6, the printed circuit board 7 is obtained. Differently from the first embodiment, the bonding members 30 and the component protecting members 50 are applied at the same applying step and are cured at the same heating step. Consequently, one applying step and one heating step can be omitted and the printed circuit board 7 can be manufactured more easily than that in the first manufacturing method. An advantage produced by the printed circuit board 7 thus obtained is the same as that in the first manufacturing method.

What is claimed is:
1. A printed circuit board comprising:
a semiconductor package comprising a main body having a substantially parallelepiped shape and a plurality of solder balls provided on one face of the main body;
a printed wiring board comprising a mounting face on which the solder balls are mounted;
a first bonding member applied around the main body of the semiconductor package, the first bonding member having a first glass transition temperature for bonding the semiconductor package to the printed wiring board;

an electronic component mounted on the mounting face positioned at a position apart from the semiconductor package and near the first bonding member; and a second bonding member applied onto the mounting face to cover the electronic component and to be continuous around the semiconductor component, to thereby form a convex portion, the second bonding member having a second glass transition temperature that is higher than the first glass transition temperature, wherein the first bonding member is a member that softens when reheated, and wherein the first bonding member is positioned between the second bonding member and the semiconductor package, and provided to be continuous from a corner portion of the semiconductor package to a vicinity of the corner portion.

2. The printed circuit board of claim 1, wherein the second bonding member is provided circularly around the semiconductor package.

3. An electronic apparatus comprising:

a casing; and a printed circuit board received in the casing, wherein the printed circuit board comprises, a semiconductor package comprising a main body having a substantially parallelepiped shape and a plurality of solder balls provided on one face of the main body;

a printed wiring board comprising a mounting face on which the solder balls are mounted;

a first bonding member applied around the main body of the semiconductor package, the first bonding member having a first glass transition temperature for bonding the semiconductor package to the printed wiring board;

an electronic component mounted on the mounting face positioned at a position apart from the semiconductor package and near the first bonding member; and a second bonding member applied onto the mounting face to cover the electronic component and to be continuous around the semiconductor component, to thereby form a convex portion, the second bonding member having a second glass transition temperature that is higher than the first glass transition temperature, and wherein the first bonding member is a member that softens when reheated, and wherein the first bonding member is positioned between the second bonding member and the semiconductor package, and provided to be continuous from a corner portion of the semiconductor package to a vicinity of the corner portion.

4. The electronic apparatus of claim 3, wherein the second bonding member is provided circularly around the semiconductor package.

* * * * *